United States Patent [19]

Yoshimura et al.

[11] Patent Number: 4,925,515

[45] Date of Patent: May 15, 1990

[54] METHOD AND APPARATUS FOR APPLYING A PROTECTIVE TAPE ON A WAFER AND CUTTING IT OUT TO SHAPE

[75] Inventors: Yoshitaka Yoshimura, Kitakatsuragi; Yasuhiro Oura, Sakurai, both of Japan

[73] Assignees: Takatori Corporation; Takatori Hitech Co., Ltd., both of Nara, Japan

[21] Appl. No.: 268,965

[22] Filed: Nov. 9, 1988

[30] Foreign Application Priority Data

Nov. 27, 1987 [JP] Japan .................. 62-301189

[51] Int. Cl.$^5$ ........................... B32B 31/18
[52] U.S. Cl. .................. 156/250; 156/267; 156/510; 156/522; 156/523; 156/530; 156/552; 83/483; 83/490
[58] Field of Search ............... 156/250, 267, 510, 522, 156/523, 530, 552; 83/483, 490

[56] References Cited

U.S. PATENT DOCUMENTS

| | | | |
|---|---|---|---|
| 4,522,679 | 6/1985 | Funakoshi et al. | 156/523 |
| 4,568,407 | 2/1986 | Barbieri et al. | 156/522 |
| 4,683,023 | 7/1987 | Sokolovsky | 156/530 |

*Primary Examiner*—Caleb Weston

*Attorney, Agent, or Firm*—Wenderoth, Lind & Ponack

[57] ABSTRACT

A method for applying a protective tape on a wafer and cutting it out to the shape of the wafer in the process of manufacture of integrated circuits and the like, and an apparatus for use in carrying out the method. The method enables the protective tape to be applied on the wafer without allowing intersurface inclusion of air bubbles and to be accurately cut along the perimeter of the wafer. Any dimensional change with respect to the wafer can be properly coped with.

The protective tape, as drawn out from a winder shaft, is applied by means of an application roller on the wafer which is supported and fixed in position on a transfer table.

The tape is cut along an orientation flat of the wafer by a subcutter which is in movement integrally with the application roller. A main cutter positioned above the wafer is then lowered and caused to swivel, whereby the protective tape is cut along a circumferential edge of the wafer so that the tape on the wafer is cut out to the contour of the wafer. Any remaining portion of the tape after the cut-out is made is wound onto a take-up shaft.

4 Claims, 6 Drawing Sheets

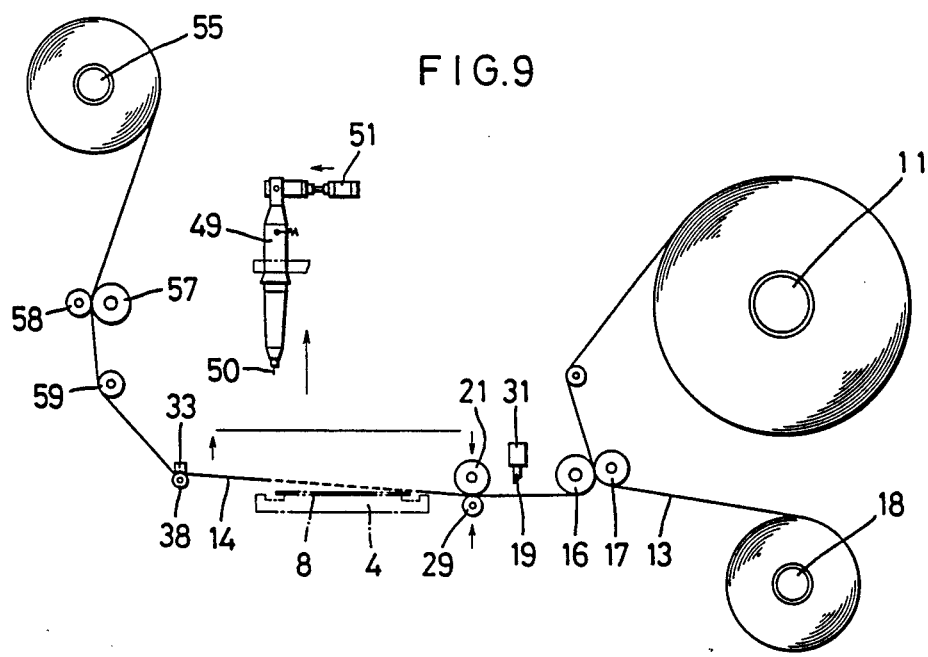
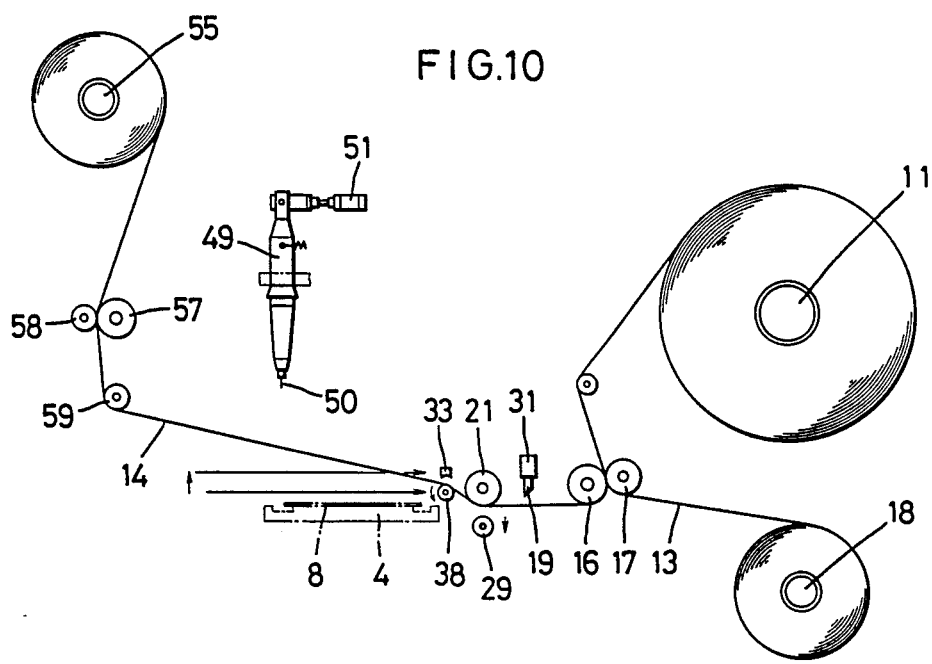

METHOD AND APPARATUS FOR APPLYING A PROTECTIVE TAPE ON A WAFER AND CUTTING IT OUT TO SHAPE

This invention relates to a method for applying a protective tape on a wafer and cutting it out to shape in the process of manufacture of integrated circuits and the like, and to an apparatus for use in carrying out the method.

Integrated circuits are manufactured by forming a highly dense arrangement of circuits for transistors, diodes, etc. on the surface of a semiconductor wafer, then cutting the wafer into individual components.

In order to compacturize each component, it is required that the wafer be made as thin as possible.

To this end, it is customary to carry out operations such as polishing the back surface of each wafer which has already passed through the process of circuitry arrangement, by using water currents. Prior to such operation, it is necessary to carry out the step of applying a protective tape on the surface of the circuit arrangement and then cutting the so applied tape along the perimeter of the wafer. Hitherto, various methods have been in practice for applying the protective tape on the wafer.

For example, a protective tape consisting of an adhesive tape wound in roll form is drawn from a winder shaft, on which it is wound, and spread with its adhesive face held underside, and a wafer which has already been properly positioned is transported to a location below the protective tape so that the tape is pressed against the surface of the wafer. After the tape is applied on the wafer, the tape is stamped out to shape by a ring-shaped cutter along the wafer. The tape, after being subjected to stamping, is wound on a take-up shaft, and the tape-applied wafer is transported to an appropriate destination.

However, this conventional method involves a problem such that since the entire underside of the protective tape is pressed against the wafer in one operation and is then applied thereon by means of an application roller, air bubbles are likely to enter an interface between the wafer and the protective tape. Another problem is that since the cutter is ring shaped so as to be contoured along the perimeter of the wafer, it must be very accurately configured; furthermore, if there is a change in the size of the wafer, cutter replacement is required.

Accordingly, it is a first object of the invention to provide a method for applying a protective tape on a wafer and cutting it out to shape which involves no possibility of air bubbles being included in an interface between the wafer and the protective tape.

It is a second object of the invention to provide a method for applying a protective tape on a wafer and cutting it out to shape which permits accurate cutting of the protective tape along the contour of the wafer.

It is a third object of the invention to provide a method of applying a protective tape on a wafer and cutting it out to shape which can readily cope with any dimensional change of the wafer.

It is a fourth object of the invention to provide an apparatus for applying a protective tape on a wafer and cutting it out to shape which is simple in construction and which can accomplish the foregoing three objects.

FIGS. 5 to 10 are front views showing, stage by stage, operations of the apparatus for protective tape application and cutting.

Figure 1:
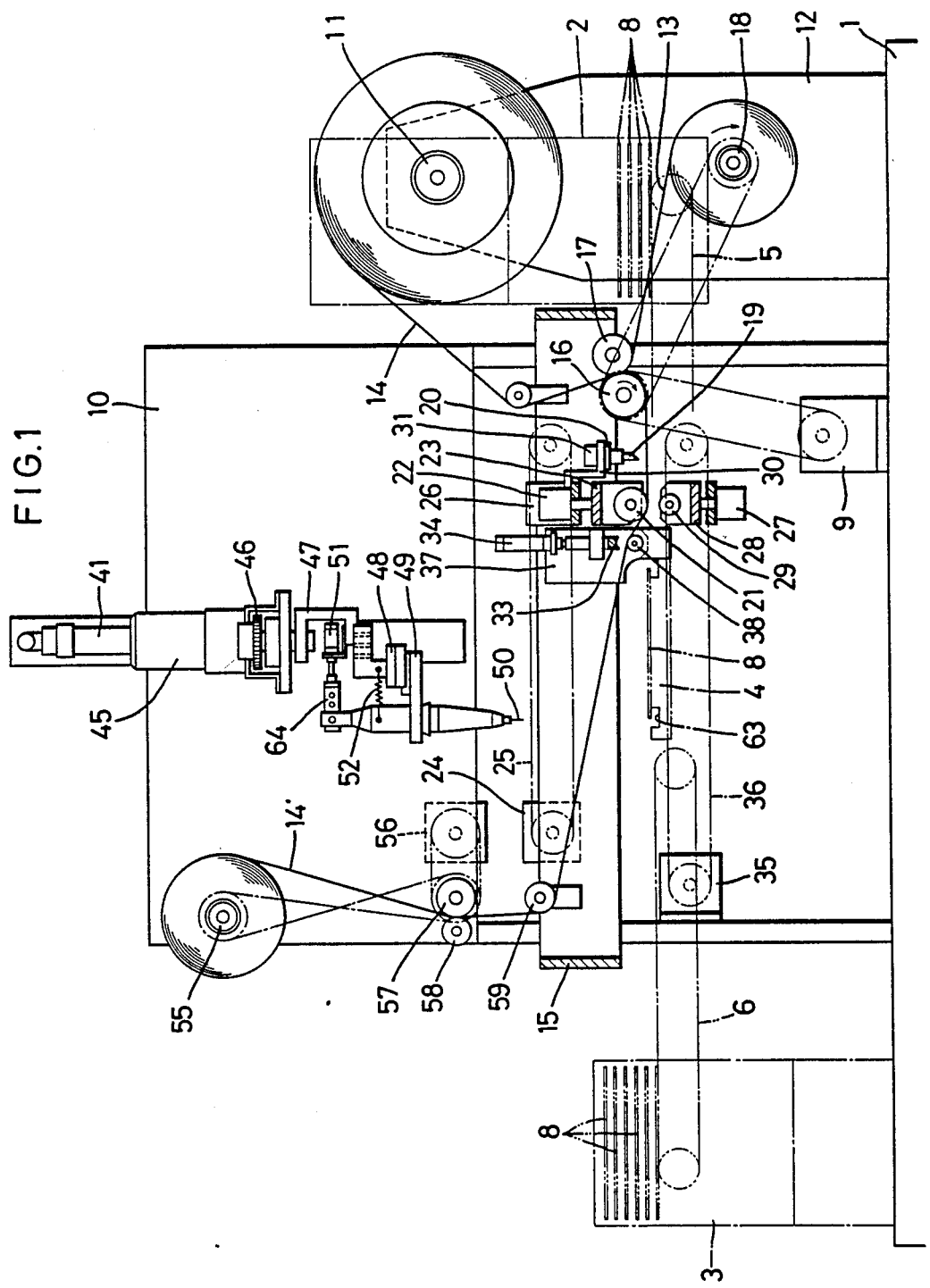
FIG. 1 is a front view showing an apparatus for protective-tape application and cutting in accordance with the invention.

In FIGS. 1 to 5, numeral 1 generally designates a machine frame, with a loader-side wafer cassette 2 mounted on the frame 1 at the right end thereof and an unloader-side wafer cassette 3 on the frame 1 at the left end thereof as shown.

On a mid-portion of the machine frame 1 there is provided a wafer transfer table 4, and between the transfer table 4 and the loader-side wafer cassette 2 and between the transfer table 4 and the unloader-side wafer cassette 3 there are arranged endless conveyor belts 5 and 6 respectively, which make a pair, right and left.

The cassettes 2, 3 are individually adapted to be moved upward and downward over a one-pitch interval between wafers so that when a lowermost wafer 8 in the cassette 2 on the belt 5 is delivered onto the transfer table 4 as the belt 5 is driven, the cassette 2 is moved downward one pitch to allow a next wafer 8 in the cassette 2 to be loaded on the belt 5, while when a wafer 8 delivered by the belt 6 is fed into the cassette 3, the cassette 3 is moved upward one pitch to be ready for receiving a next wafer 8.

Numeral 11 designates a winder shaft for protective tape mounted on a stand 12 disposed behind the cassette 2, the protective tape 14, together with a separator 13, being wound in roll form on the winder shaft 11.

Numeral 15 designates a frame disposed behind and above the machine frame 1. On the frame 15 at the stand 12 side there are mounted a first drive roller 16 and a driven roller held in pressure contact therewith. On a lower portion of the stand 12 there is mounted a winding shaft 18 for the separator 13, so that protective tape 14 is drawn from the winder shaft 11 and the separator 13 is wound onto the winding shaft 18 as the roller 16 and the winding shaft 18 are driven by a motor 9 on the machine frame 1 through belt transmission and other means.

Numeral 21 designates an applicator roller which is rotatably mounted to an up- and down-movable frame 23 driven by a cylinder 22. The cylinder 22 is fixed to a frame movable by a travelling belt 25 driven by a motor 24. Below the applicator roller 21 there is disposed in opposed relation thereto a non-rotatable up- and down-movable roller 29 mounted to an up- and down-movable frame 28 which is driven by a cylinder 27 to move upward and downward.

Numeral 30 designates a Z-shaped bracket fixed to the frame 26. A mounting plate 20 for the subcutter 19 is fixed to the bracket 30, a cylinder 31 being fixed to the mounting plate 20, the subcutter 19 being mounted in a downward facing pattern to the mounting plate 20 so that it is driven by the cylinder 30 to move up and down.

Figure 2:
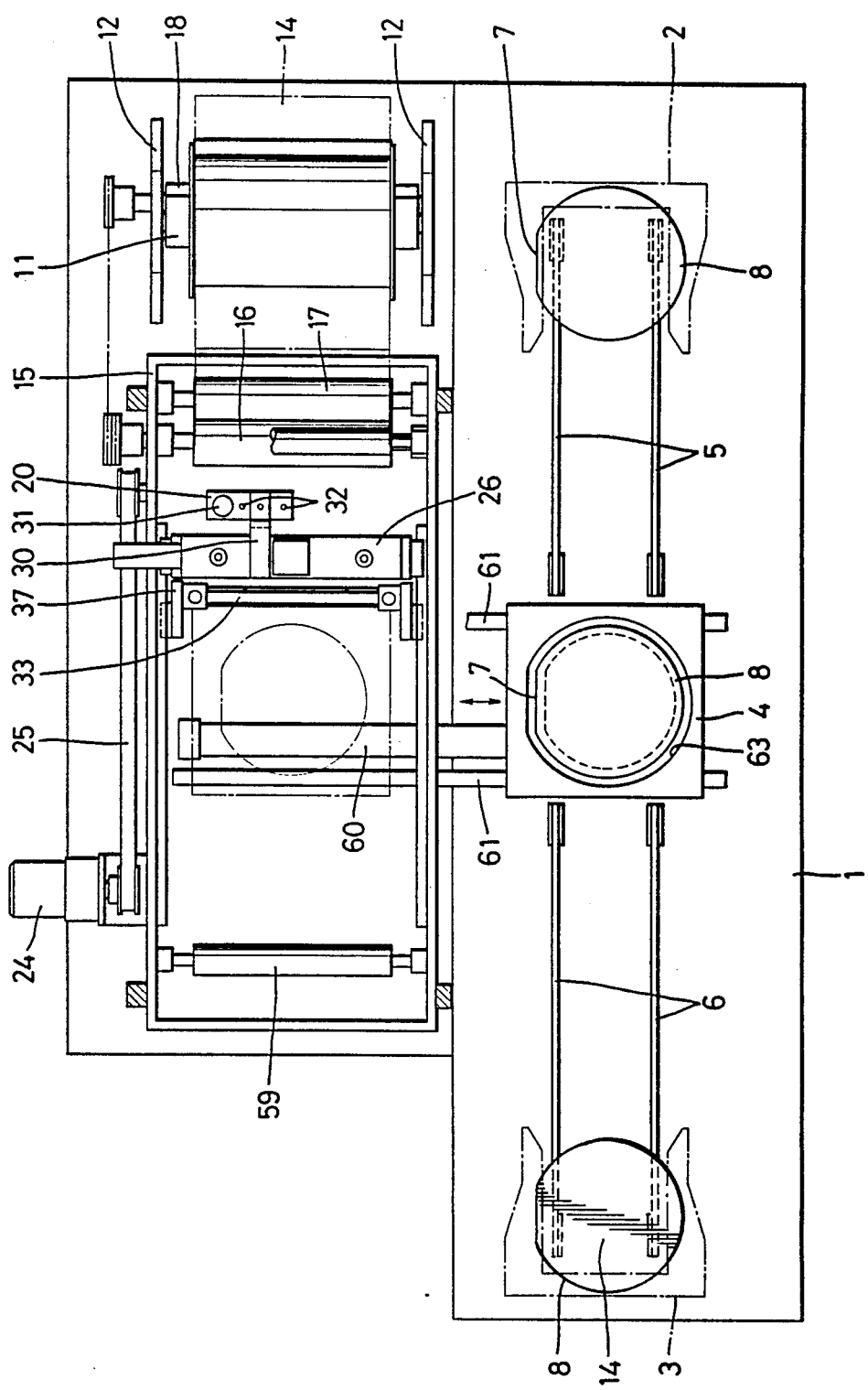
FIG. 2 is a plan view of same.
Figure 3:
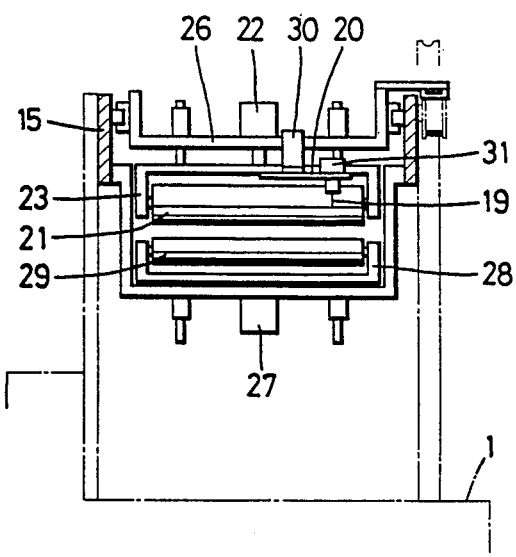
FIG. 3 is a longitudinal sectional view in side elevation showing an application roller portion and a subcutter portion in the apparatus.

As FIG. 2 shows, the mounting plate 20 is provided with mounting holes 32 at a plurality of locations, whereby the holes 32 can be selectively used to change the mounting position of the mounting plate 20 relative to the bracket 30 so that the position of the subcutter 19 is selectively changeable.

Numeral 33 designates a chuck which is up and down movable by a cylinder 34 and mounted to a moving member 37 which is laterally movable by a travel belt 36 driven by a motor 35.

A tape drawing roller 38 positioned right below the chuck 33 is mounted to the travel member 37.

Therefore, the chuck 33 and the drawing roller 38 are integrally movable in the rightward and leftward directions in FIG. 2.

Figure 4:
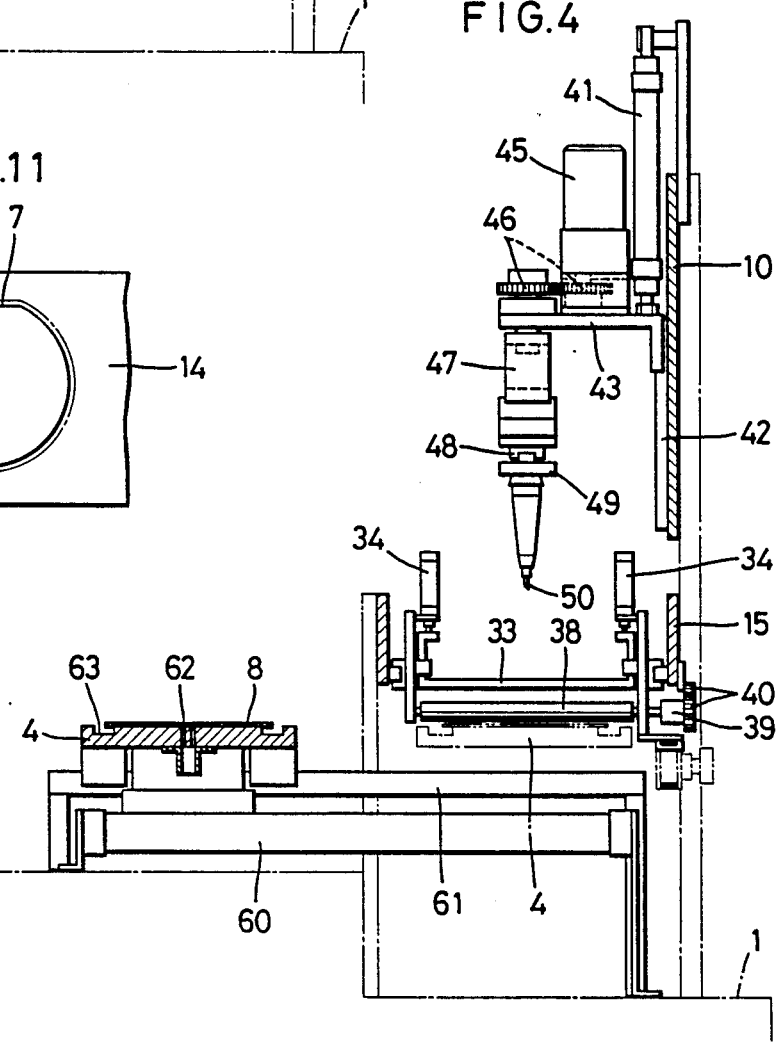
FIG. 4 is a longitudinal sectional side view showing a transfer table and the subcutter portion in the apparatus.
Figure 5:
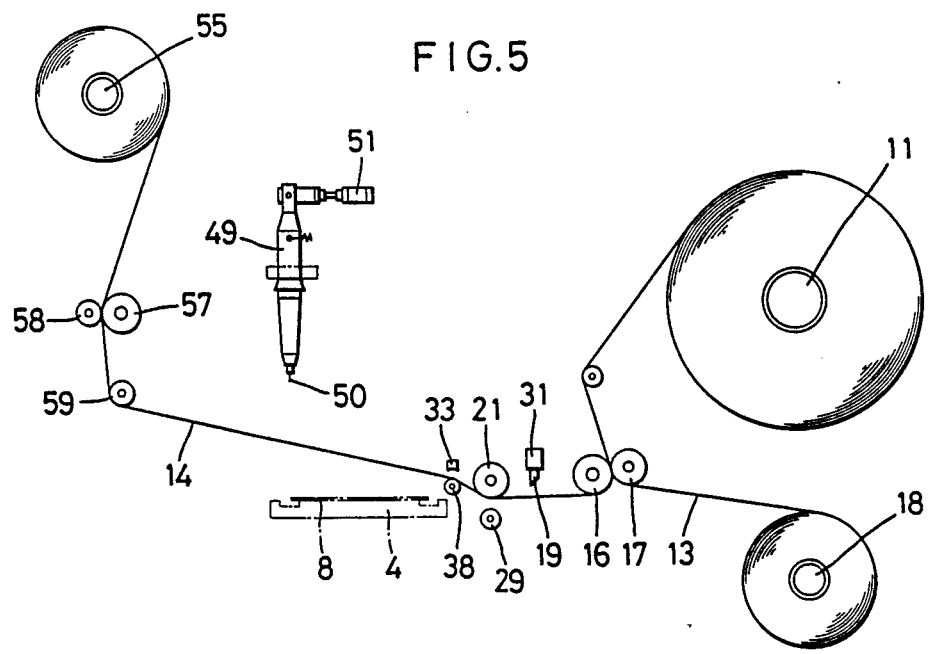

As FIG. 4 shows, the roller 38 is not allowed to rotate because of a one-way clutch 39 during its movement in the leftward direction in FIG. 1, and is allowed to rotate counterclockwise by a clutch pinion 40 only during its rightward movement.

Centrally in front of a support plate 10 on the frame 15, as FIG. 4 shows, there is provided an elevating table 43 which is up and down movable along a guide 42 by the action of a cylinder 41, a rotary frame 47 being disposed on the table 43 for being driven to rotate by a motor 45 through a gear 46. On the rotary frame 47 there is mounted a cutter mounting member 49 which moves rightward and leftward along a guide frame 48, a main cutter 50 being fixed to the mounting member 49. As FIG. 1 shows, the rightward and leftward movement of the mounting member 49 is restricted by a cylinder 51 and a spring 52.

Numeral 55 designates a take-up shaft for tape 14 after cutting, and below the take-up shaft 55 there are disposed a second drive roller 57 which is driven by a motor 56, and a driven roller 58 which is in contact with the roller 57. A guide roller 59 is disposed below the rollers 57, 58.

In operation of the apparatus of the invention as above arranged, protective tape 14 drawn from the winder shaft 11 is separated from the separator 13 at it passes between the first drive roller 16 and the driven roller 17, and then it is conducted above the tape drawing roller 38 passing under both the first drive roller 16 and the application roller 21, being then conducted through the guide roller 59 to the rollers 57, 58, through which it is wound onto the take-up shaft 55.

The wafer transfer table 4 is of such arrangement that it travels along a pair of guide rails, right and left, and is conducted by the cylinder 60 from a position connecting the centers of the wafer cassettes 2, 3 to a position below the swivel range of the main cutter 50.

The transfer table 4, as FIG. 4 shows, is of the vacuum suction type having a vacuum suction port 62, and on its top surface there is formed a groove 63 extending along the outer lower edge of the wafer 8.

Nextly, the function of the above described apparatus will be explained with reference to the schematic flow diagrams given in FIGS. 5 to 10. At a start position shown in FIG. 5, wafer 8, already delivered by the belt 5 from the loader-side wafer cassette 2 onto the transfer table 4 as illustrated in FIG. 2, is positioned with respect to its orientation flat 7 (hereinafter referred to as "orifla") by a known positioning device (not shown) and is then fixed in position on the transfer table 4 through vacuum suction.

The transfer table 4 on which the wafer 8 is fixed in position as above mentioned is actuated by the cylinder 34 to travel to a position below the mounting unit for the main cutter 50 and it stops there.

Figure 6:
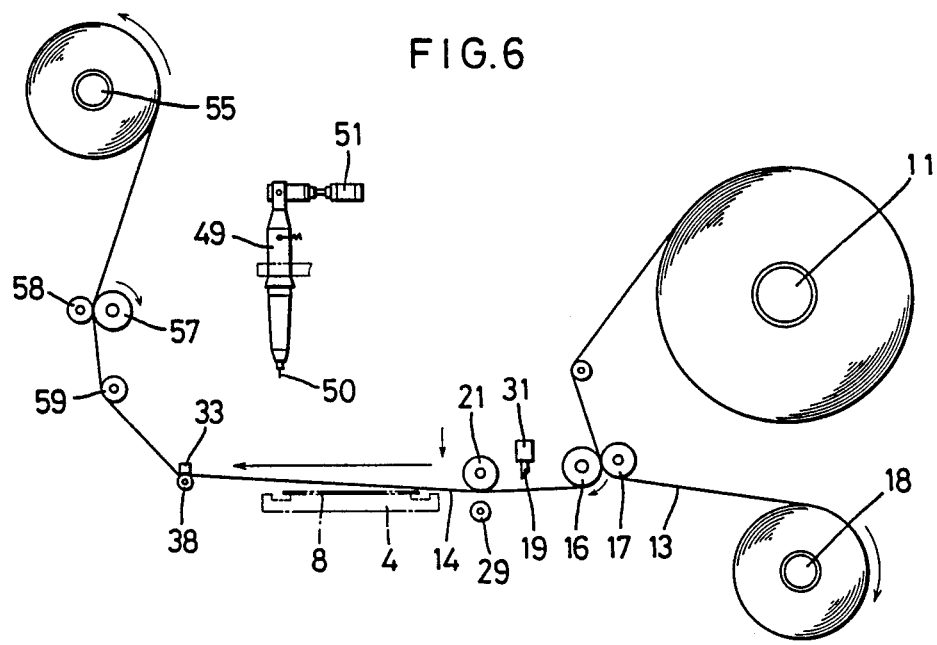

Subsequently, the chuck 33 is actuated by the cylinder 34 to move downward to fix the protective tape 14 in position on the draw roller 38, and the belt 36 is driven by the motor 35 to actuate the travelling member 37 to move forward so that, as FIG. 6 shows, the tape 14 is spread over the wafer 8 on the transfer table 4.

Figure 7:
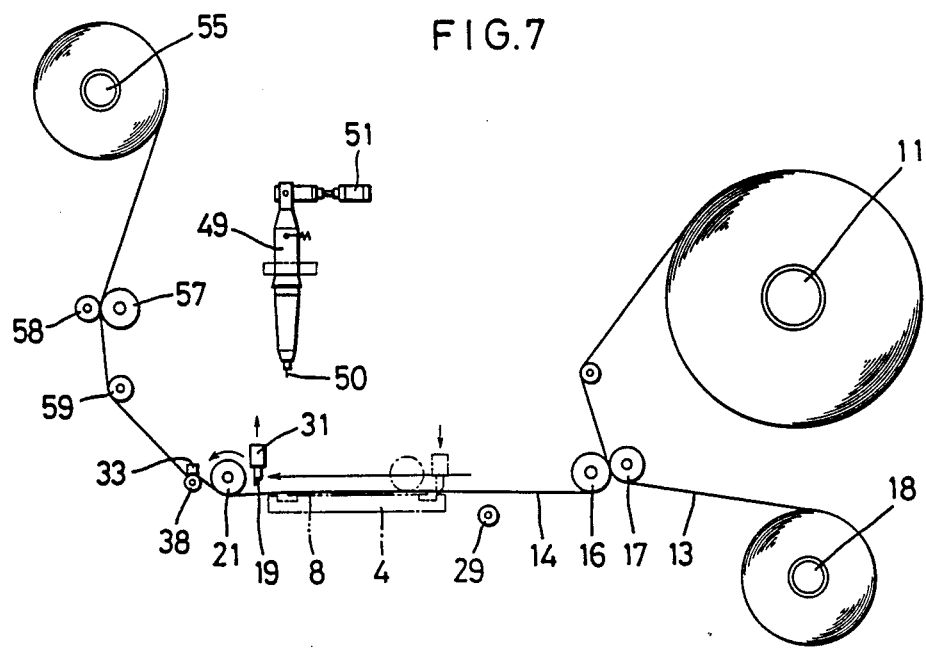

Nextly, the up- and down-movable frame 23 is actuated by the cylinder 22 to move downward and the application roller 21 pushes down the protective tape 14. Thereafter, the belt 25 is driven by the motor 24 to actuate the application roller 21 to run while in rotation over the wafer 8, whereby the tape 14 is applied on the wafer 7 as FIG. 7 shows.

In this case, the application roller 21 operates to apply the tape 14 on the wafer 8 beginning from one end of the wafer 8; as such, there is no possibility of air being included in the interface between the wafer 8 and the tape 14.

Figure 11:
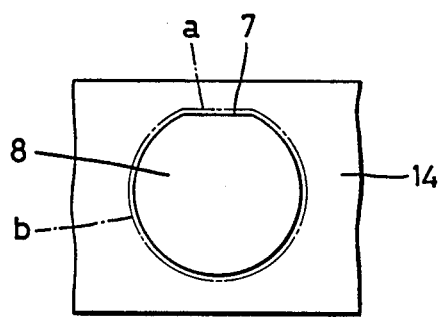
FIG. 11 is a plan view showing a protective tape as it appears when it is cut by the subcutter and the main cutter.

In this conjunction, the subcutter 19 travels along with the roller 21. Therefore, when the subcutter 19 is actuated to run after it is lowered as shown by chain line in FIG. 7, the subcutter 19 operates to cut the tape 14 along the orifla 7 of the wafer 8 as can be seen from FIG. 11a.

Alternatively, however, after the tape 14 is applied by the application roller 21 to the wafer 8 as above described, and when the subcutter 31 is going to return to its original position, the cylinder 31 is actuated to lower the subcutter 19 so that the tape 14 is cut along the orifla 7 in the course of a return stage.

Figure 8:
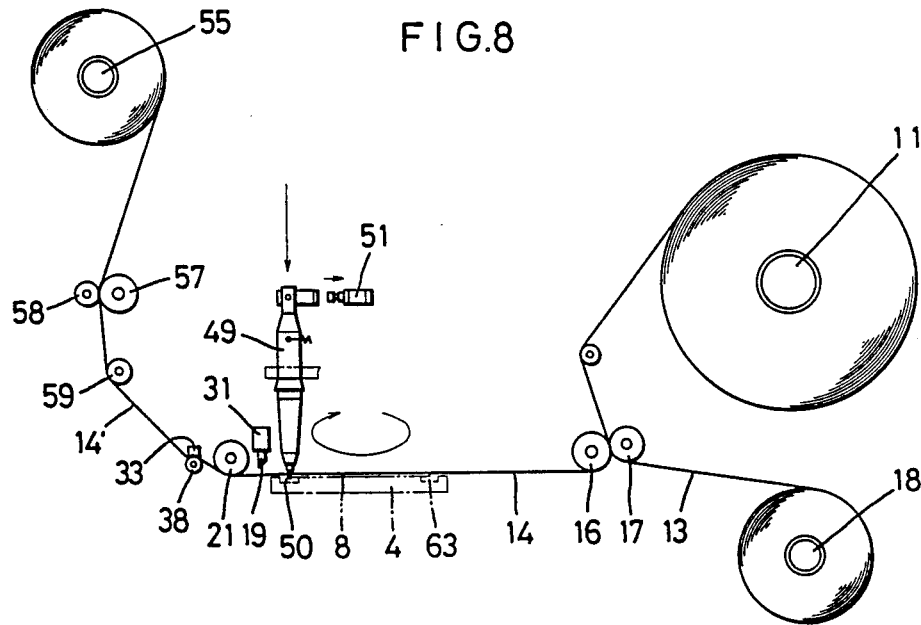

When the application roller 21 is in the state of momentary stop after the protective sheet has been applied on the wafer 8, the cylinder 41 operates to lower the up- and down-movable table 43, whereupon the cutter mounting member 49 is also lowered so that, as FIG. 8 shows, the main cutter 50 cuts into the tape 14 along the perimeter of the wafer 8. Simultaneously the cylinder 51 operates to cause the cutter 50 to be urged by the spring 52 for contact with the periphery of the wafer.

Then, the rotary frame 47 is driven by the motor 45 to swivel the cutter 5 along the perimeter of the wafer 8, the tape 14 being thus cut to same shape as the wafer 8. In this case, the lower ends of the subcutter 19 and the main cutter 50 are caused to move in the groove 63 of the transfer table 4.

After cutting operation, as FIG. 9 shows, the cylinder 41 and the motor 24 operate to return the application roller 21 and the subcutter 19 to their respective original positions.

Nextly, the cylinder 34 operates to move the chuck 33 upward to release the tape 14, and the belt 36 is driven by the motor 35 to return the travel member 37 to its original position. Accordingly, both the chuck 33 and the drawing roller 38 on the travel member 37 return to their original position, so that the postcutting tape 14 is raised.

As above described, the protective tape is applied, the tape 14 is cut, and thereupon the wafer 8, in conjunction with the transfer table 4, returns to its original position between the belts 5 and 6 under the action of the cylinder 60, being then allowed to stop movement.

Subsequently, the wafer 8 is released to vacuum suction and delivered by suitable means onto the belt 6 by which it is supplied into the unloader-side cassette 3, one cycle of operation being thus completed.

In case where some change is made with respect to the size of the wafer 8, the plurality of mounting holes in the mounting plate 20 can be advantageously used to change the mounting position of the subcutter 19 relative to the bracket 30. To change the mounting position of the main cutter 50, the plurality of mounting holes in the bracket 64 and the plurality of holes in the guide frame 48 can be used to change the mounting position of the main cutter, whereby the swivel radius of the main cutter 50 is changed, it being thus possible to readily cope with the changed situation without any replacement being required of the cutter.

In the above described embodiment, the subcutter 19 and the main cutter 50 are each of a knife shaped arrangement having a cutting blade. As an alternative to such type, an ultrasonic cutter or a heater-type cutter for fusion-cutting the protective tape through heat generation may be conveniently used.

Generally, for each individual cylinder, an air cylinder can be advantageously used; but for some of the cylinders, electromagnetic means may be employed in place of air cylinder.

As described above, protective tape is drawn, while being held in position by both the chuck and the draw roller, to a position above the wafer on the transfer table, and the tape so drawn is spread above the wafer. Thereafter, the application roller is moved so that the tape is pressed against the wafer and applied thereon beginning from one end; thus, there is no possibility of air being included in the interface between the tape and the wafer.

Furthermore, at the orifla portion provided in the wafer, the tape is accurately cut by the subcutter which straightforwardly moves along with the application roller, and then the main cutter cuts into the tape while swivelling about the center of circular perimeter of the wafer in concentric relation therewith. Thus, cutting of the tape is accurately performed along the perimeter of the wafer. As such, in case where there is a change in the size of the wafer, such change can readily be coped with, without necessity of cutter replacement.

What is claimed is:

1. A method for applying a protective tape on a wafer and cutting it out to shape, which comprises applying the protective tape drawn from a winder shaft on a wafer supported and fixed in position on a table by means of an application roller, cutting the protective tape along an orientation flat of the wafer by means of a subcutter which moves in conjunction with the application roller, then lowering a main cutter positioned above and causing it to swivel, whereby the protective tape is cut by the main cutter along the circular perimeter of the wafer, winding the remaining portion of the protective tape so cut onto an appropriate take-up shaft.

2. An apparatus for applying a protective tape on a wafer and cutting it out to shape, comprising a wafer transfer table for supporting thereon a wafer delivered from a loader-side wafer cassette and transporting same to a location below an operative range of a main cutter, an application roller movable while pressing a protective tape drawn from a winder shaft against the wafer on the transfer table, a subcutter for cutting the protective tape along an orientation flat on the wafer while moving along with the application roller, a main cutter for cutting the protective film along the circumferential outer edge of the wafer while being positioned above the wafer in a standstill condition on which protective tape has been applied, and a take-up means for winding thereon the protective tape from which a cutout has been made.

3. An apparatus for applying a protective tape on a wafer and cutting it out to shape as set forth in claim 2, wherein the wafer transfer table for supporting the wafer thereon is formed on its top surface with a groove contoured to extend along the outer circumferential edte of the wafer, whereby the lower ends of the subcutter and the main cutter are adapted to move in the groove.

4. An apparatus for applying a protective tape on a wafer and cutting it out to shape as set forth in claim 2, wherein the wafer transfer table for supporting the wafer therein is provided with a vacuum suction post for fixing the wafer in position on the transfer table.

* * * * *